(12) United States Patent
Iwaki et al.

(10) Patent No.: US 8,912,971 B2
(45) Date of Patent: Dec. 16, 2014

(54) FILTER, DUPLEXER AND ELECTRONIC DEVICE

(75) Inventors: Masafumi Iwaki, Tokyo (JP); Tokihiro Nishihara, Tokyo (JP); Masanori Ueda, Tokyo (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 392 days.

(21) Appl. No.: 13/131,833

(22) PCT Filed: Nov. 28, 2008

(86) PCT No.: PCT/JP2008/071683
§ 371 (c)(1),
(2), (4) Date: May 27, 2011

(87) PCT Pub. No.: WO2010/061477
PCT Pub. Date: Jun. 3, 2010

(65) Prior Publication Data
US 2011/0227807 A1    Sep. 22, 2011

(51) Int. Cl.
*H01Q 1/50* (2006.01)
*H03H 9/60* (2006.01)
*H03H 9/05* (2006.01)
*H03H 9/56* (2006.01)
*H03H 9/64* (2006.01)

(52) U.S. Cl.
CPC ............ *H03H 9/605* (2013.01); *H03H 9/0571* (2013.01); *H03H 9/0576* (2013.01); *H03H 9/564* (2013.01); *H03H 9/568* (2013.01); *H03H 9/6483* (2013.01)
USPC .......................................... 343/850; 343/851

(58) Field of Classification Search
USPC ................................. 343/850–865
See application file for complete search history.

(56) References Cited

U.S. PATENT DOCUMENTS

| 2002/0140520 A1 | 10/2002 | Hikita et al. |
| 2003/0090338 A1 | 5/2003 | Muramatsu |
| 2004/0130410 A1 | 7/2004 | Nishimura et al. |

(Continued)

FOREIGN PATENT DOCUMENTS

| CN | 1518219 A | 8/2004 |
| CN | 1913348 A | 2/2007 |

(Continued)

OTHER PUBLICATIONS

International Search Report (ISR) issued in PCT/JP2008/071683 (International application) mailed in Feb. 2009 for Examiner consideration.

(Continued)

*Primary Examiner* — Matthew Mikels
(74) *Attorney, Agent, or Firm* — Chen Yoshimura LLP

(57) ABSTRACT

A ladder type filter includes series resonators S1~S4 connected in series between an input terminal In and an output terminal Out, parallel resonators P1~P3 connected in parallel between the input terminal In and the output terminal Out, a resonator RP connected in series with the series resonators S1~S4 between the input terminal and the output terminal, the resonator RP having a resonance frequency lower than resonance frequencies of the series resonators S1~S4, and an inductor Lp connected in parallel with the resonator. According to the present ladder filter, signals having frequencies away from the pass band can be suppressed by an attenuation pole formed by the inductor. It is further possible to suppress the insertion loss in the pass band by the resonator.

7 Claims, 21 Drawing Sheets

(56) References Cited

U.S. PATENT DOCUMENTS

| | | |
|---|---|---|
| 2004/0140866 A1 | 7/2004 | Taniguchi |
| 2004/0227585 A1 | 11/2004 | Taniguchi et al. |
| 2006/0139125 A1* | 6/2006 | Shiga-ken et al. ............ 333/193 |
| 2007/0030096 A1* | 2/2007 | Nishihara et al. ............ 333/133 |
| 2008/0024243 A1 | 1/2008 | Iwaki et al. |
| 2008/0136555 A1 | 6/2008 | Schmidhammer |
| 2008/0150652 A1 | 6/2008 | Itou |
| 2009/0278629 A1 | 11/2009 | Tamura |

FOREIGN PATENT DOCUMENTS

| | | |
|---|---|---|
| CN | 101300736 A | 11/2008 |
| EP | 1 246 358 A2 | 10/2002 |
| JP | 9-167937 A | 6/1997 |
| JP | 11-68512 A | 3/1999 |
| JP | 2002-344349 A | 11/2002 |
| JP | 2003-198325 A | 7/2003 |
| JP | 2004-242281 A | 8/2004 |
| JP | 2007-336479 A | 12/2007 |
| WO | 2004/102798 A1 | 11/2004 |
| WO | 2007/066608 A1 | 6/2007 |

OTHER PUBLICATIONS

Written Opinion (PCT/ISA/237) issued in PCT/JP2008/071683 (International application) mailed in Feb. 2009.
English translation of Written Opinion (PCT/ISA/237) issued in PCT/JP2008/071683 in Jul. 2011.
Chinese Office Action dated Jul. 25, 2013, in a counterpart Chinese patent application No. 200880132136.0.
European Search Report dated Mar. 24, 2014, in a counterpart European patent application No. 08878434.3.
Chinese Office Action dated Aug. 12, 2014, in a counterpart Chinese patent application No. 200880132136.0.

* cited by examiner

*: RESONANCE POINT

FILTER, DUPLEXER AND ELECTRONIC DEVICE

TECHNICAL FIELD

The present invention relates to filers, duplexers and electronic devices, and more particularly, to ladder type filters, duplexers and electronic devices.

BACKGROUND ART

A ladder type filter with resonators arranged in the form of a ladder is used in radio communications such as cellular phone communications. The ladder type filter realizes a bandpass filter that passes signals having desired frequencies. The bandpass filter is required to suppress signals having frequencies away from the pass band such as harmonic components that are the second harmonics of the pass band (that is, the desired frequencies), the third harmonics and so on.

As a method for suppressing the harmonic components of the pass band, there is known a method using a lumped constant LC resonance circuit or a distributed constant transmission line (Patent Document 1).
Patent Document 1 Japanese Patent Application Publication No. 2003-198325

DISCLOSURE OF THE INVENTION

Problems to be Solved by the Invention

However, the method described in Patent Document 1 has a difficulty in downsizing of filter. In addition, in case where transmission lines are made close to each other for downsizing, a coupling with a parasitic capacitance or a parasitic inductance may be formed and degrade the filter characteristics.

The present invention was made in view of the above problems, and has an object of providing a filter, a duplexer and an electronic device capable of downsizing and suppressing signals having frequencies away from the pass band.

Means for Solving the Problems

A ladder type filter includes: series resonators connected in series between an input terminal and an output terminal; parallel resonators connected in parallel between the input terminal and the output terminal; a resonator connected in series with the series resonators between the input terminal and the output terminal, the resonator having a resonance frequency lower than resonance frequencies of the series resonator; and an inductor connected in parallel with the resonator.

A duplexer and an electronic device include the above-described ladder type filter.

A duplexer includes a transmission filter and a reception filter, a transmission filter and a reception filter, at least one of the transmission filter and the reception filter including series resonators connected in series between an input terminal and an output terminal, and parallel resonators connected in parallel between the input terminal and the output terminal; a resonator connected in series with the series resonators between the input terminal and the output terminal, the resonator having a resonance frequency lower than resonance frequencies of the series resonators, and an inductor connected in parallel with the resonator.

Effects of the Invention

It is possible to suppress signals having frequencies away from the pass band by an attenuation pole formed by an inductor. In addition, it is possible to suppress insertion loss in the pass band caused by resonators.

BRIEF DESCRIPTION OF THE DRAWINGS

FIG. 6($b$) is a plan view thereof;

BEST MODES FOR CARRYING OUT THE INVENTION

Figure 1:
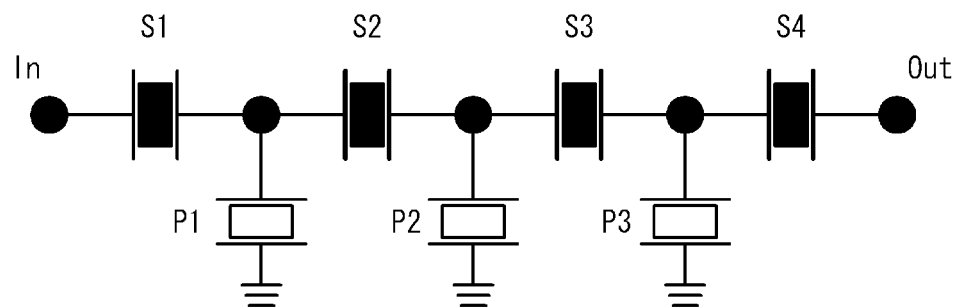
FIG. 1 is a circuit diagram of a ladder type filter.

First, ladder type filters are described. FIG. 1 is a circuit diagram of a ladder type filter. Referring to FIG. 1, one or multiple series resonators S1~S4 are connected in series between an input terminal In and an output terminal Out. One or multiple parallel resonators P1~P3 are connected in parallel between the input terminal In and the output terminal Out. That is, the parallel resonators P1~P3 are respectively connected between a node between the series resonators S1 and S2 and ground, between a node between the series resonators S2 and S3 and ground, and between a node between the series resonators S3 and S4 and ground. As described above, the series resonators S1~S4 and the parallel resonators P1~P3 are connected in the form of a ladder.

Figure 2A:
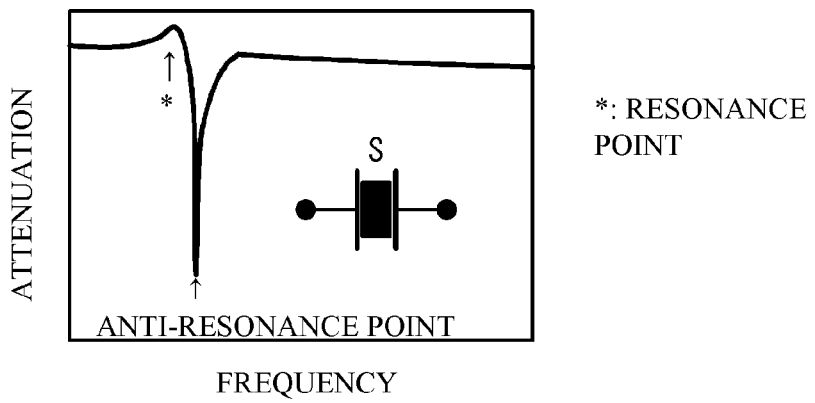
FIG. 2($a$) is a diagram of a bandpass characteristic of a series resonator, FIG. 2($b$) is a diagram of a bandpass characteristic of a parallel resonator, and FIG. 2($c$) is a diagram of a communication characteristic of a ladder type filter.
Figure 2B:
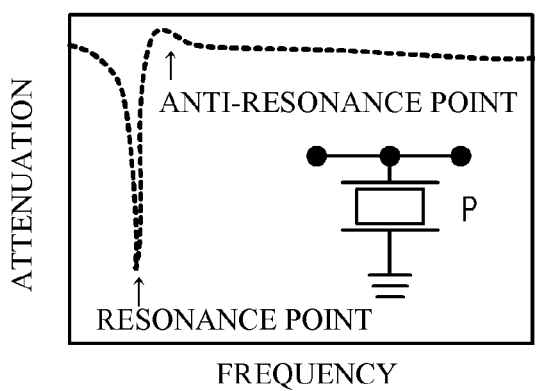
Figure 2C:
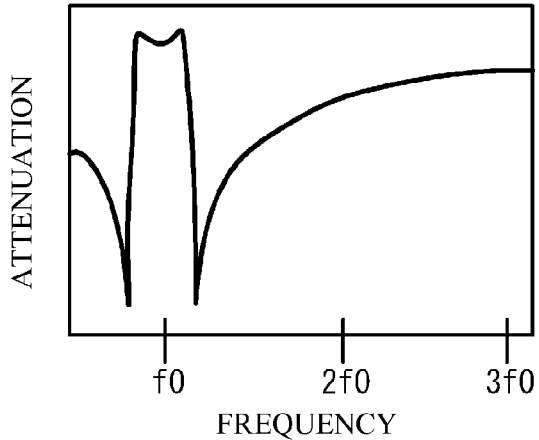

Next, the operation of the ladder type filter is described. FIG. 2(a) is a diagram of a bandpass characteristic of a series resonator S. Referring to FIG. 2(a), the minimum amount of attenuation appears at a resonance point, and the maximum amount of attenuation appears at an anti-resonance point located at a higher frequency than that of the resonance point. FIG. 2(b) is a diagram of a bandpass characteristic of a parallel resonator P. Referring to FIG. 2(b), the maximum amount of attention appears at the resonance point, and the minimum amount of attention appears at the anti-resonance point. FIG. 2(c) is a diagram of a bandpass characteristic of a ladder filter composed of the series resonator S and the parallel resonator P. Referring to FIG. 2(c), the anti-resonance point of the parallel resonator P is at a frequency lower than that of the resonance point of the series resonator S. Thus, the pass band is formed by the anti-resonance point of the parallel resonator P and the resonance point of the series resonator S. Regions close to the pass band have large amounts of attenuation. However, smaller amounts of attenuation are available at a frequency 2f0 of the second harmonic and a frequency 3f0 of the third harmonic where f0 is the center frequency of the pass band of the ladder type filter.

For example, the transmission signal of the cellular phone terminal contains not only a signal having a transmission frequency but also its harmonic components such as the second harmonic and the third harmonic. Thus, the transmission filter is required to suppress the harmonic components of the transmission frequency (that is, the harmonics of the pass band).

Figure 3A:
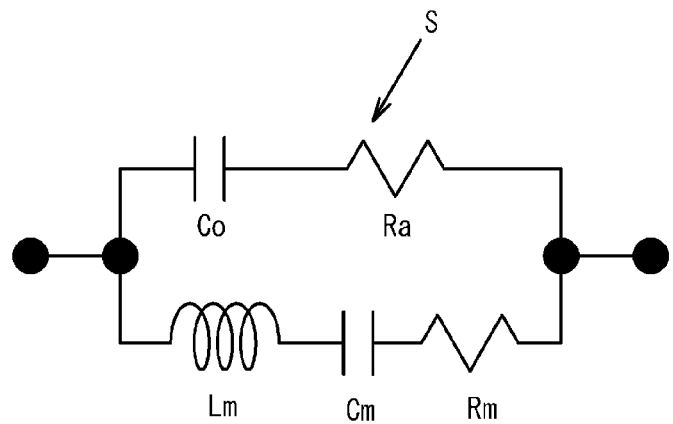
FIG. 3($a$) is an equivalent circuit of a resonator, and FIG. 3($b$) is a diagram of a bandpass characteristic thereof.
Figure 3B:
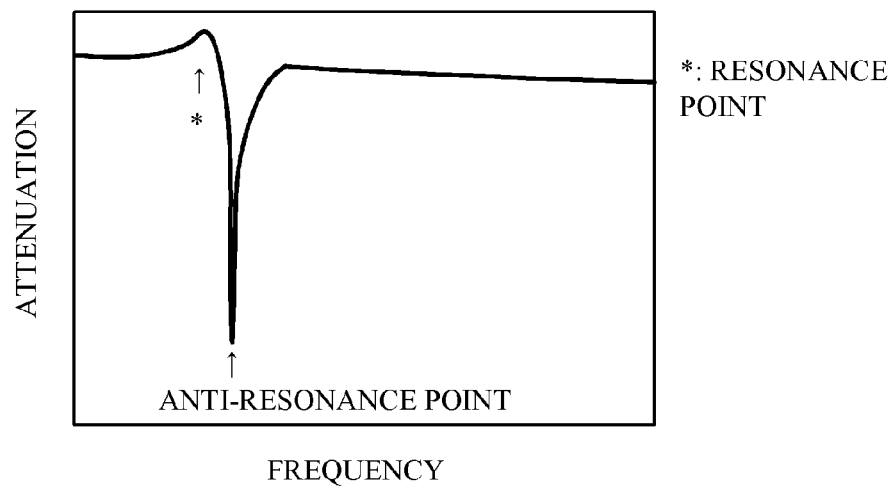

Next, a description is given of the principle of suppressing the harmonic components of the pass band. FIG. 3(a) is an equivalent circuit of the resonator S, and FIG. 3(b) is a diagram of a bandpass characteristic of the resonator S. As illustrated in FIG. 3(a), the resonator S has an equivalent circuit in which an inductor Lm, a capacitor Cm and a resistor Rm are connected in series, and a capacitor C0 and a resistor Ra are connected in series. The circuit composed of the inductor Lm the capacitor Cm and the resistor Rm, and the circuit composed of the capacitor C0 and the resistor Ra are connected in parallel. As illustrated in FIG. 3(b), the bandpass characteristic of the resonator S is the same as that illustrated in FIG. 2(a).

Figure 4A:
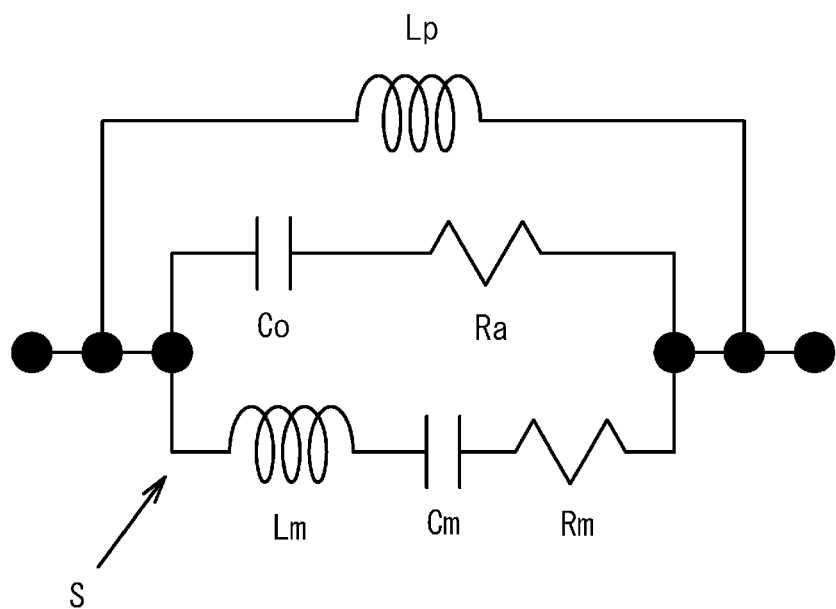
FIG. 4($a$) is an equivalent circuit of a resonator with an inductor being connected in parallel, and FIG. 4($b$) is a diagram of a bandpass characteristic thereof.
Figure 4B:
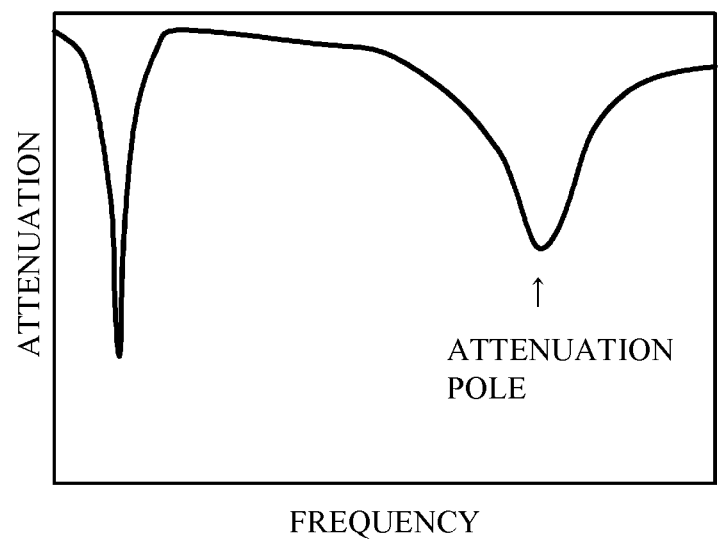

FIG. 4(a) is an equivalent circuit of the resonator S with which an inductor Lp is connected in parallel. FIG. 4(b) illustrates a bandpass characteristic of the resonator S with the inductor Lp being connected in parallel. The maximum point (attenuation pole) of the amount of attenuation resulting from the inductance of the inductor Lp is formed at a frequency higher than that of the maximum point of the amount of attenuation resulting from the resonance S. The attenuation pole may be set arbitrarily by selecting the inductance of the inductor Lp.

Embodiments based on the above principle are described below.

Embodiment 1

Figure 5A:
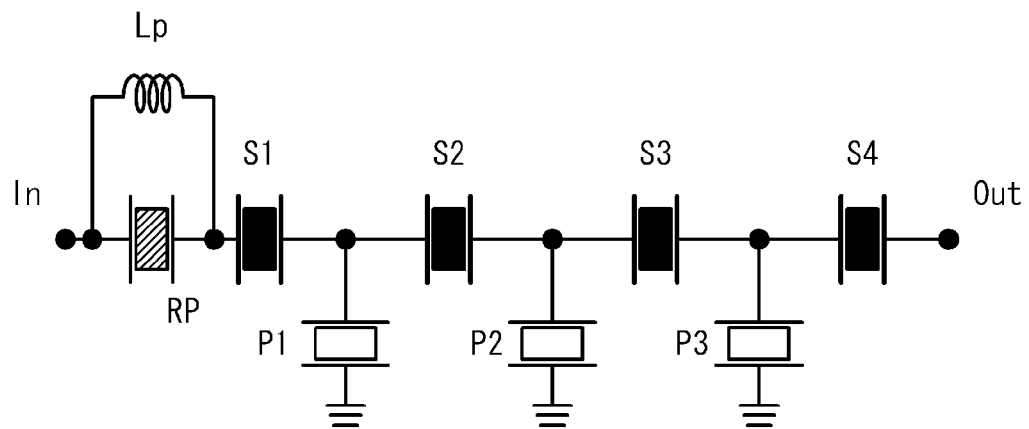
FIG. 5($a$) is a circuit diagram of a filter in accordance with an embodiment 1, and FIG. 5($b$) is a diagram of a bandpass characteristic thereof.
Figure 5B:
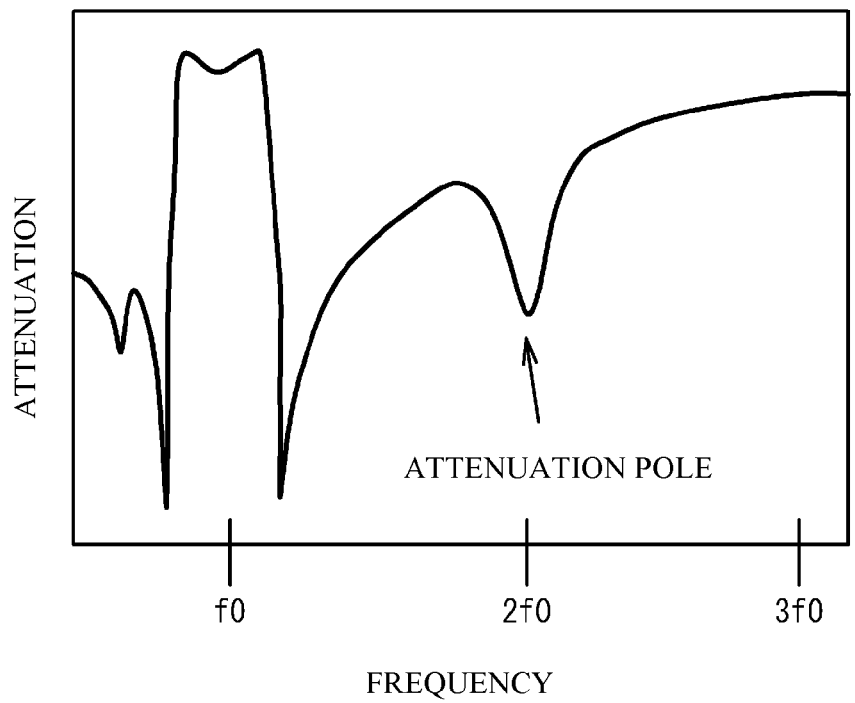

FIG. 5(a) is a circuit diagram of a filter in accordance with embodiment 1, and FIG. 5(b) illustrates a bandpass characteristic of the filter in accordance with the embodiment 1. Referring to FIG. 5(a), a resonator RP is connected between the input terminal In and the output terminal Out in series with the circuit of the series resonators S1~S4. The resonance frequency of the resonator RP is lower than the resonance frequencies of the series resonators S1~S4. The inductor Lp is connected in parallel with the resonator RP. The other structures of the present filter are the same as those of the filter in FIG. 1 and a description thereof is omitted here.

Referring to FIG. 5(b), the attenuation pole by the inductor Lp is set equal to twice the center frequency f0 of the pass band. It is thus possible to suppress the signal of the second harmonic of the pass band. The inductor Lp has an inductance that enables the attenuation pole to be formed at the harmonic side of the pass band of the ladder type filter, so that the amount of attenuation of the specific frequency at the harmonic side of the pass band can be improved. Further, the inductor Lp has an inductance that enables the attenuation pole to be formed at a frequency that is an integer multiple of the pass band, so that the corresponding harmonic of the signal in the pass band can be suppressed.

Figure 6A:
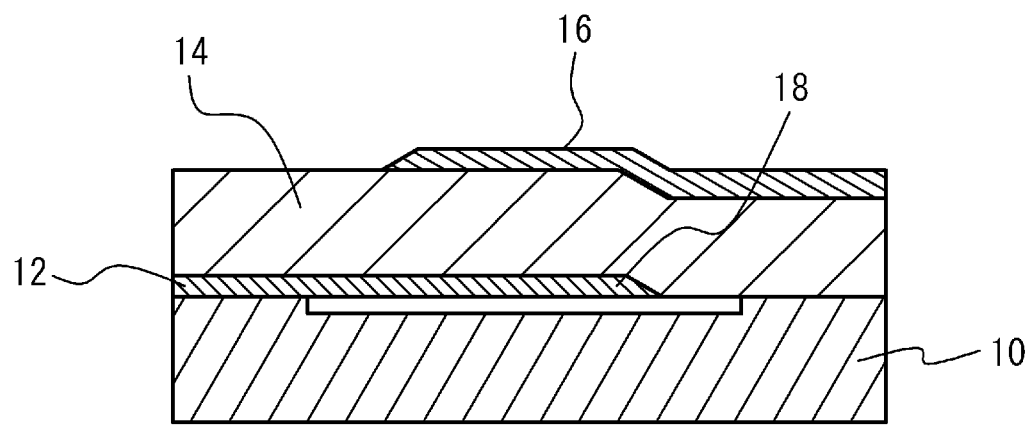
FIG. 6($a$) is a sectional view of a piezoelectric thin-film resonator.
Figure 6B:
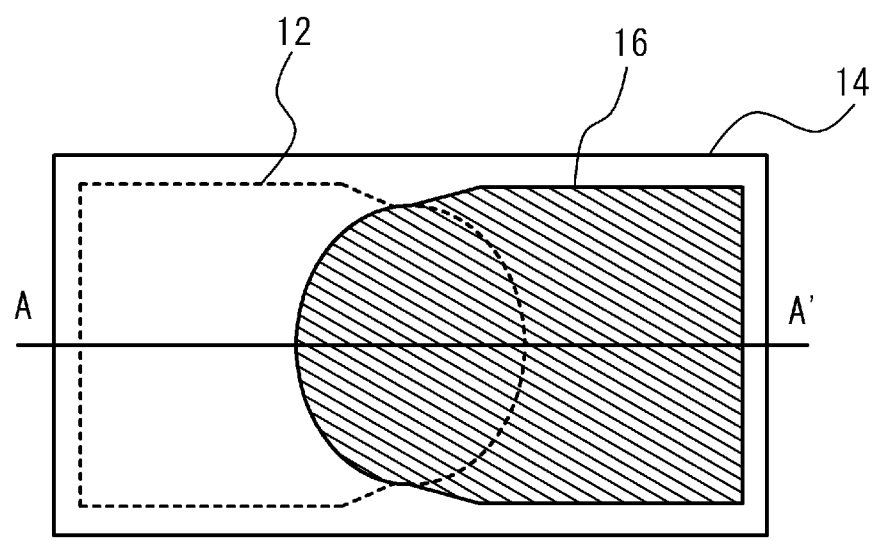

FIGS. 6(a) and 6(b) are diagrams of a piezoelectric thin-film resonator (FBAR: Film Bulk Acoustic Resonator), which is an example of the resonators S1~S4, P1~P3 and RP. FIG. 6(a) is a sectional view taken along a line A-A' in FIG. 6(b). A lower electrode 12 is formed on a substrate 10, and a piezoelectric film 14 containing Al, for example, is formed on the lower electrode 12. An upper electrode 16 is formed on the piezoelectric film 14. A gap is formed between the lower electrode 12 and the substrate 10. As described above, FBAR may be used as the resonator.

Figure 7A:
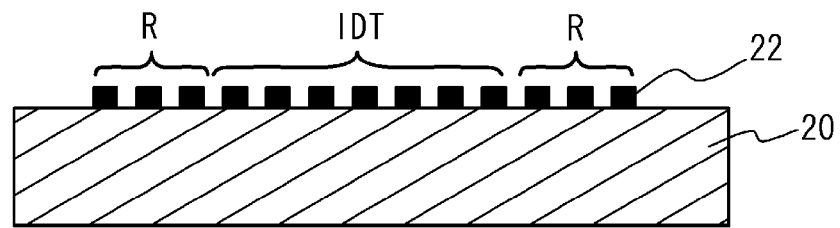
FIG. 7($a$) is a sectional view of a surface acoustic wave resonator, and FIG. 7($b$) is a plan view thereof.
Figure 7B:
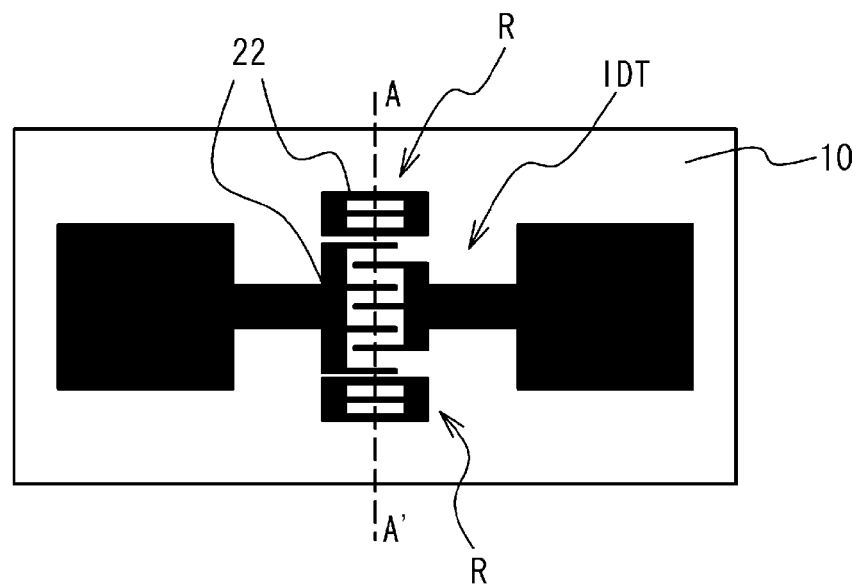

FIGS. 7(a) and 7(b) are diagrams that illustrate a surface acoustic wave (SAW) resonator as an example of the resonators S1~S4, P1~P3 and RP. FIG. 7(a) is a sectional view taken along a line A-A' in FIG. 7(b). An interdigital transducer IDT and reflectors R are formed on a piezoelectric substrate 20. As described above, the SAW resonator may be used as the resonator.

Figure 8:
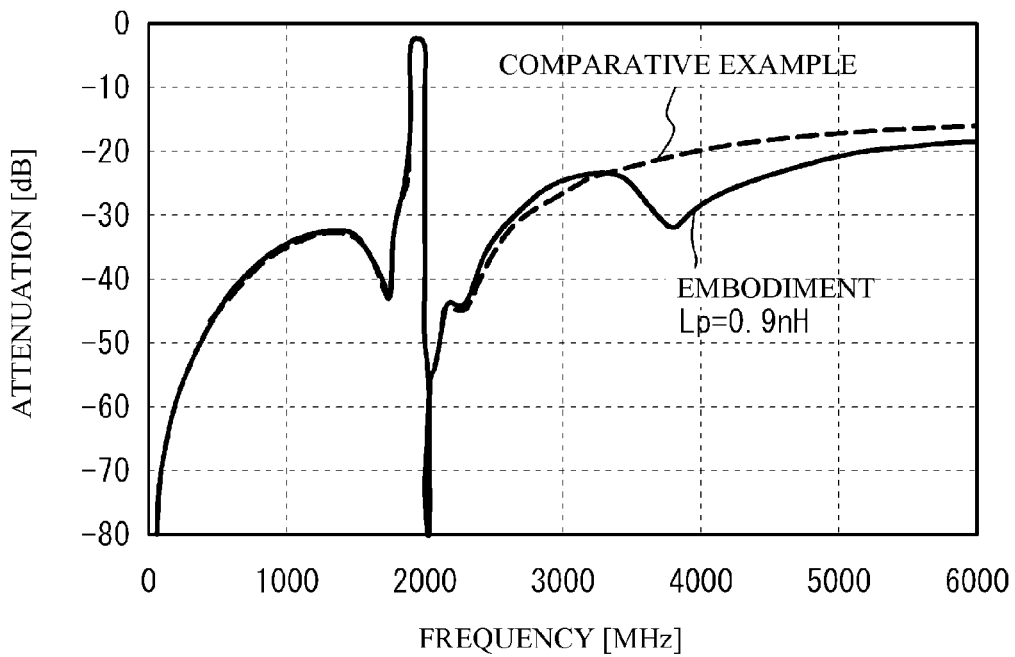
FIG. 8 is a diagram of bandpass characteristics of the embodiment 1 and a comparative example 1.

FIG. 8 is a diagram of a bandpass characteristic of the first in accordance with the embodiment 1. A solid line indicates simulation results of the filter illustrated in FIG. 5(a) (embodiment 1), and a broken line indicates simulation results of the filter in FIG. 1 (comparative example) in which he resonator RP and the inductor Lp are not connected. Both the embodiment 1 and the comparative example suppose W-CDMA (Wide band Code Division Multiple Access), and the pass band is approximately 2 GHz. The resonance frequencies of the series resonators S1~S4 are 1969 MHz, and the resonance frequencies of the parallel resonators P1~P3 are 1889 MHz. The resonance frequency of the resonator RP is 1595 MHz, and the inductance of the inductor Lp is 0.9 nH. As illustrated in FIG. 8, the attenuation pole is formed at approximately 4 GHz in the embodiment 1.

Figure 9:
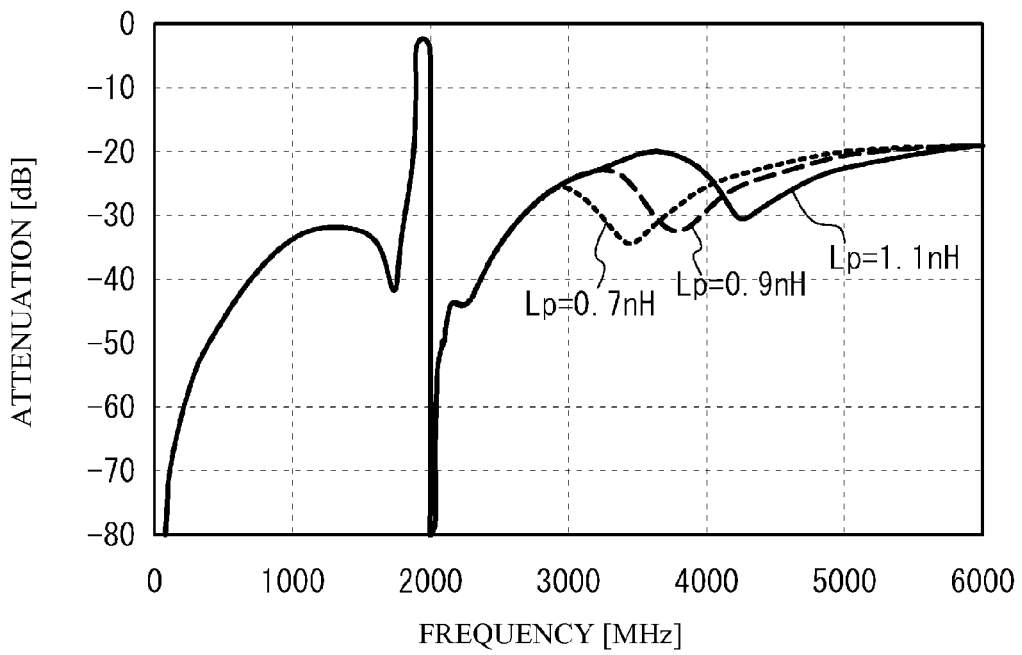
FIG. 9 is a diagram of bandpass characteristics obtained by varying the inductance of an inductor Lp.

FIG. 9 illustrates bandpass characteristics of the embodiment 1 with the inductance of the inductor Lp being set equal to 0.7 nH, 0.9 nH and 1.1 nH. As in the case of FIG. 9, the frequency of the attenuation pole may be set arbitrarily by the inductance of the inductor Lp.

Figure 10:
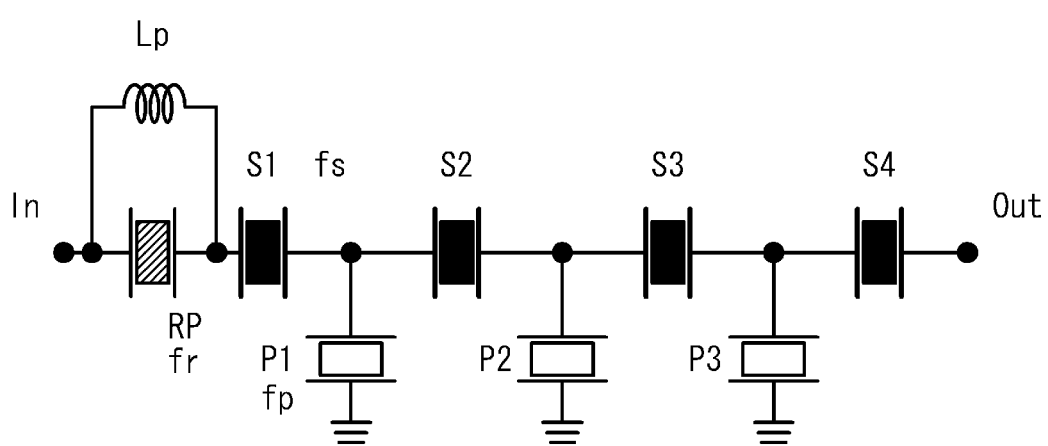
FIG. 10 is a circuit diagram of a filter.
Figure 11A:
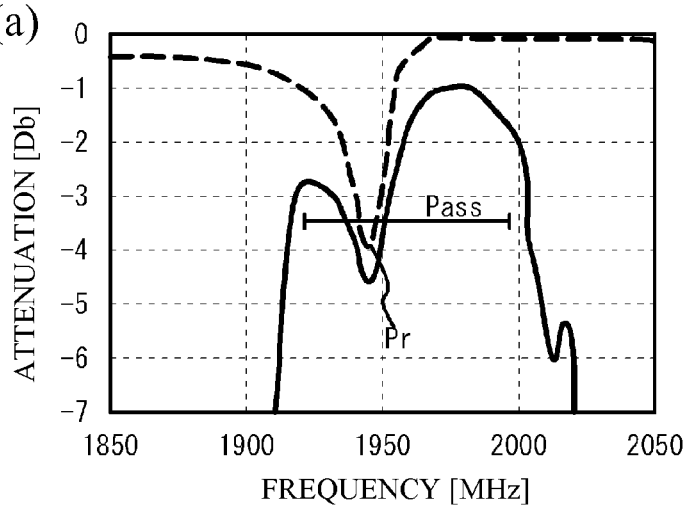
FIGS. 11($a$), 11($b$) and 11($c$) are respectively diagrams of bandpass characteristics obtained for fr=fs, fs>fr>fp and fr=fp, respectively.

The preferable resonance frequency of the resonator RP is now studied. Referring to FIG. 10, it is assumed that the resonance frequencies of the series resonators S1~S4 are denoted as fs, the resonance frequencies of the parallel resonators P1~P3 are denoted as fp, and the resonance frequency of the resonator RP is denoted as fr. The resonance frequencies fs of the series resonators S1~S4 are approximately equal to each other, and the resonance frequencies fp of the parallel resonators P1~P3 are approximately equal to each other. FIG. 11(a) illustrates simulation results of bandpass characteristics obtained when fr=fs in FIG. 10. A solid line indicates a bandpass characteristic of the whole filter, and a broken line indicates a bandpass characteristic of the resonator RP obtained when the inductor Lp is connected. An attenuation pole Pr resulting from the resonance point of the resonator RP appears within a pass band Pass of the filter.

Figure 11B:
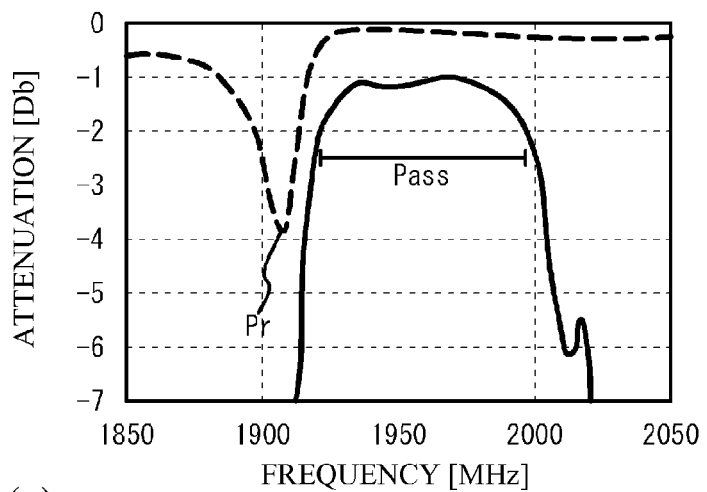
Figure 11C:
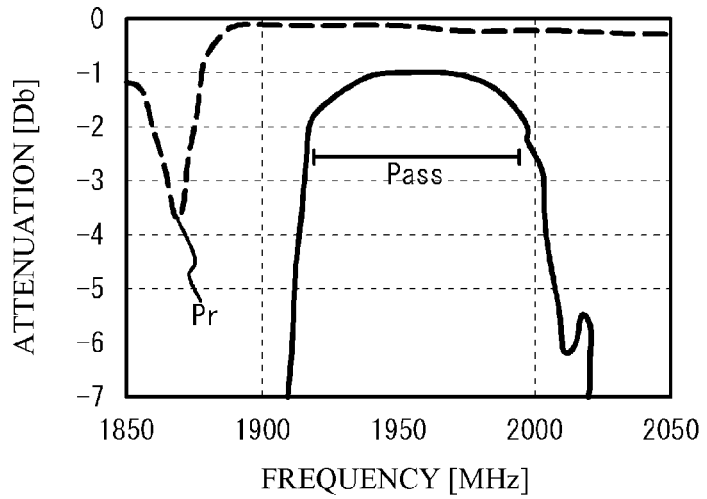

FIG. 11(b) illustrates simulation results of bandpass characteristics obtained when fs>fr>fp in FIG. 10. The attenuation pole Pr resulting from the resonance point of the resonator RP appears at the low-frequency side of the pass band Pass. FIG. 11(c) illustrates simulation results of bandpass characteristics obtained when fr=fp in FIG. 10. The attenuation pole Pr appears at the further lower side of the pass band Pass.

As illustrated in FIG. 11(b), the attenuation pole Pr is required to be located outside of the pass band Pass. Further, the amount of attenuation by the resonator RP at the high-frequency side is smaller than that at the low-frequency side. Thus, in order to suppress the insertion loss of the filter in the pass band Pass, the attenuation pole Pr is preferably formed at the low-frequency side of the pass band Pass. Thus, the resonance frequency fr of the resonator RP is preferably lower than the resonance frequencies fs of the series resonator S1~S4.

When the attenuation pole Pr is formed away from the pass band Pass, the amount of attenuation resulting from the resonator RP in the pass band Pass increases. Thus, it is preferable that the resonance frequency fr of the resonator RP is lower than the resonance frequencies of the series resonators S1~S4 and are close to the resonance frequencies of the parallel resonators P1~P3. For example, preferably, fs>fr>fp.

Figure 12A:
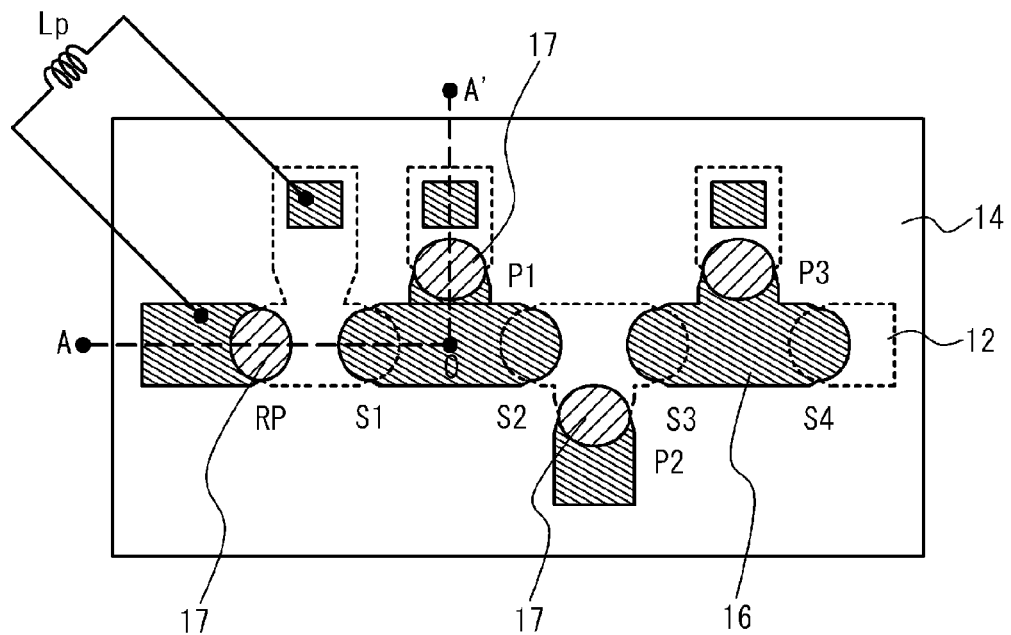
FIG. 12($a$) is a plan view of a filter, and FIG. 12($b$) is a sectional view thereof.
Figure 12B:
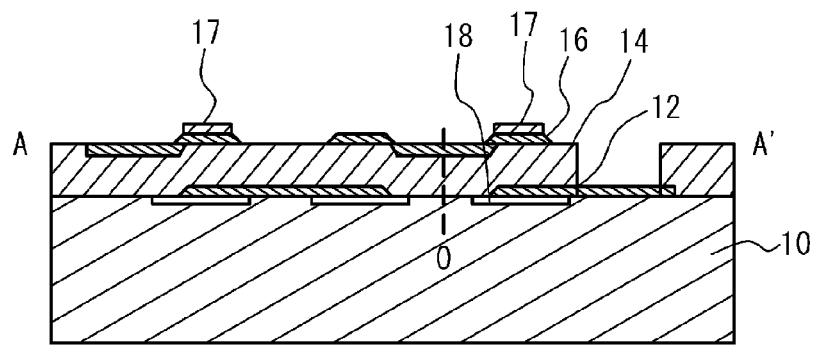

FIGS. 12(a) and 12(b) are diagrams of a filter chip having a filter using FBARs in which fr=fp. FIG. 12(a) is a plan view of the filter chip, and FIG. 12(b) is a sectional view taken along a line A-O-A' in FIG. 12(a). The structures of the series resonators S1~S4 are the same as illustrated FIGS. 6(a) and 6(b). The parallel resonators P1~P3 and the resonator RP are configured to have adjustment films 12 formed on the upper electrodes 16. The adjustment films 17 enable the resonance frequencies fp of the parallel resonators P1~P3 and the resonance frequency fr of the resonator RP to be lower than the resonance frequencies fs of the series resonators S1~S4. As described above, the resonance frequency fr of the resonator RP is preferably equal to the resonance frequencies fp of the parallel resonators P1~P3. Thus, it is enough to have only two resonance frequencies in the filter and to prepare only one thickness for the adjustment films 17. It is thus possible to simplify the fabrication process of the filter.

Figure 13:
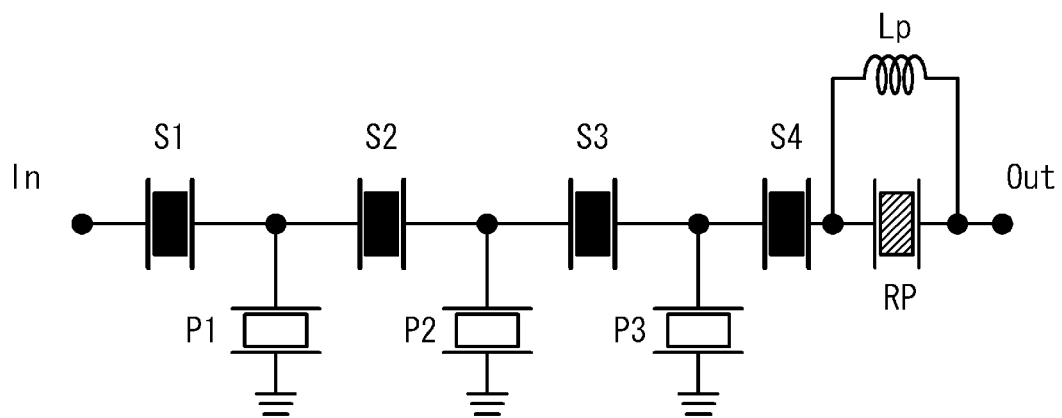
FIG. 13 illustrates another example of the embodiment 1.

FIG. 13 is a circuit diagram of another example of the filter in accordance with the embodiment 1. As illustrated in FIG. 13, the resonator RP with which the inductor Lp is connected in parallel is formed closer to the output terminal Out than the series resonators S1~S4.

Figure 14A:
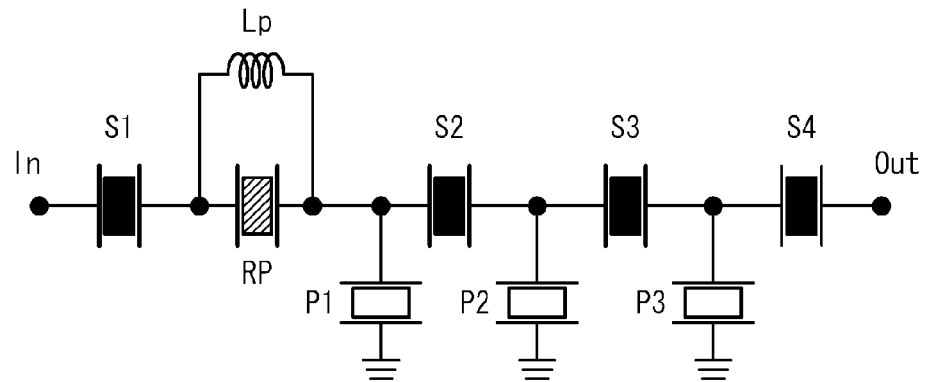
FIGS. 14($a$) through 14($c$) illustrate other examples of the embodiment 1.
Figure 14B:
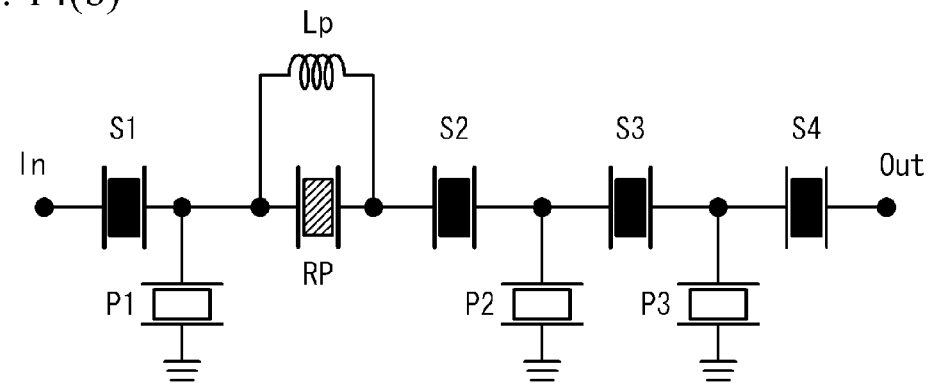
Figure 14C:
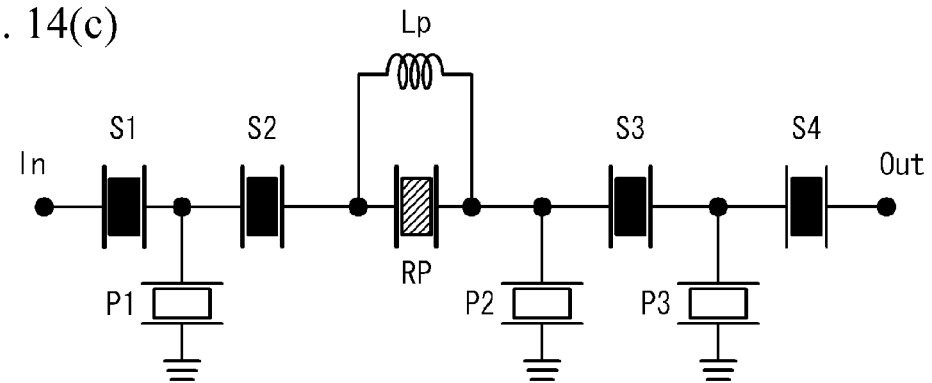

FIGS. 14(a) through 14(c) illustrate other examples of the filter of the embodiment 1. The example illustrated in FIG. 14(a) has the resonator RP connected in series between the series resonator S1 and the parallel resonator P1. The example illustrated in FIG. 14(b) has the resonator RP connected in series between the parallel resonator P1 and the series resonator S2. The example in FIG. 14(c) has the resonator RP connected in series between the series resonator S2 and the parallel resonator P2.

As illustrated in FIGS. 5(a), 13, 14(a), and 14(b), the resonator RP may have an arbitrary position as long as the resonator RP is connected between the input terminal In and the output terminal Out. However, in order to easily make a connection with the inductor Lp, the resonator RP is preferably positioned closer to the input terminal In or the output terminal Out than all the series resonators S1~S4.

Embodiment 2

Figure 15A:
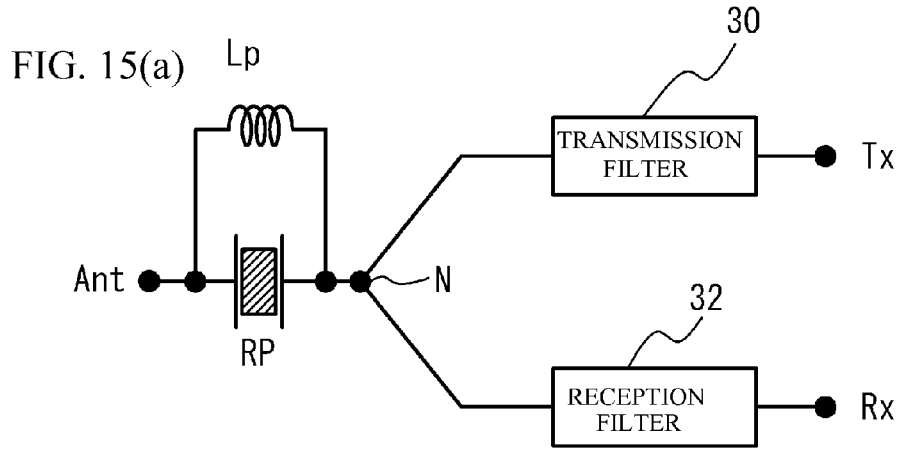
FIGS. 15($a$) through 15($c$) are block diagrams of duplexers in accordance with an embodiment 2.
Figure 15B:
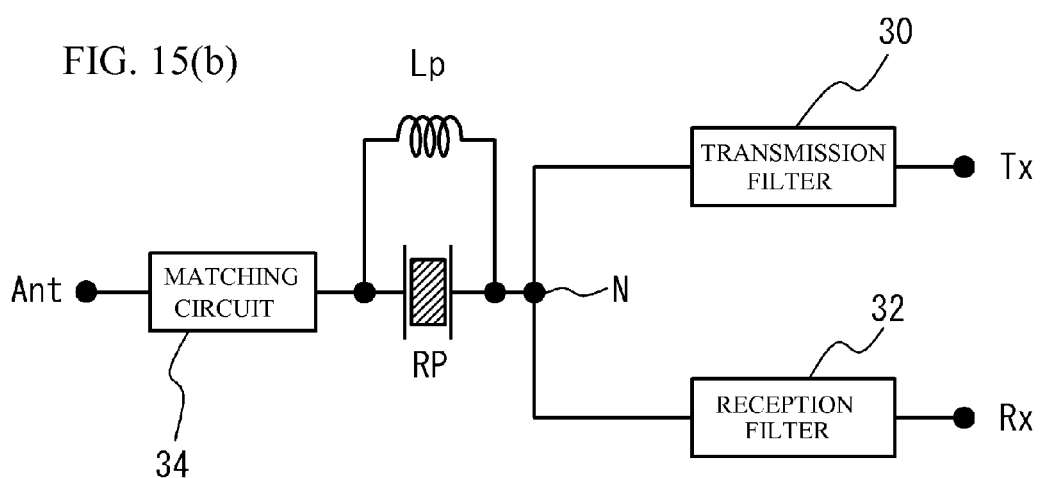
Figure 15C:
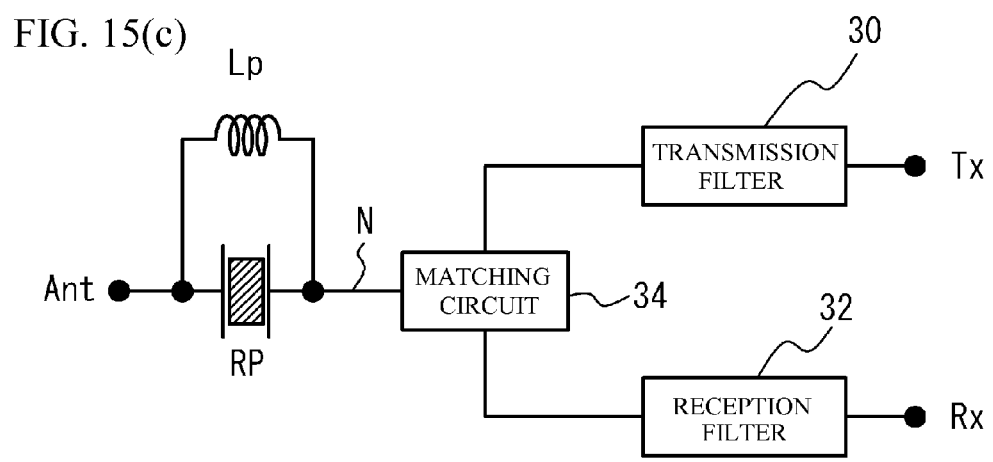

Embodiment 2 is an exemplary duplexer. FIGS. 15(a) through 15(c) are circuit diagrams of duplexers in accordance with the embodiment 2. Referring to FIG. 15(a), a duplexer has a common terminal Ant, a transmission filter 30 (first filter) and a reception filter 32 (second filter), which filters are connected in parallel with the common terminal Ant. The transmission filter 30 and the reception filter 32 are connected together at a node N. The transmission filter 30 is connected between the node N and a transmission terminal Tx. The reception filter 32 is connected between the node N and a reception terminal Rx.

The transmission filter 30 has a pass band that passes the frequency of the transmission signal. The transmission signal input via the transmission terminal Tx passes through the transmission filter 30 and is output from the common terminal Ant. The transmission filter 30 rejects the frequency of the reception signal. Thus, the reception signal input to the common terminal Ant is not output to the transmission terminal Tx. The reception filter 32 has a pass band that passes the frequency of the reception signal. The reception signal input to the common terminal Ant passes through the reception filter 32 and is output from the reception terminal Rx. The reception filter 32 rejects the frequency of the transmission signal. Thus, the transmission signal is not output to the reception terminal Rx.

In FIG. 15(a), the resonator RP is connected between the common terminal Ant and the node N. At least one of the transmission filter 30 and the reception filter 32 is a ladder type filter as illustrated in FIG. 1, and the resonance frequency of the resonator RP is set lower than the resonance frequencies of the series resonators S1~S4 of at least one of the transmission filter 30 and the reception filter 32. It is thus possible to provide the attenuation pole resulting from the inductor Lp at the high-frequency side of the pass band of at least one of the transmission filter 30 and the reception filter 32 as in the case of the embodiment 1. It is thus possible to suppress, for example, the second harmonic and the third harmonic of the transmission signal or the reception signal.

Since the resonator RP is connected between the common terminal Ant and the node N, the attenuation pole resulting from the inductor Lp may be used to suppress the second and third harmonics of both the transmission signal and the reception signal.

The second and third harmonics frequently lead to problems in the transmission signal. Therefore, it is preferable that the transmission filter 30 is a ladder type filter, and the resonance frequency of the resonator RP is lower than the resonance frequencies of the series resonators S1~S4 of the transmission filter 30.

As illustrated in FIG. 15(b), the resonator RP may be connected between a matching circuit 34 (for example, phase shifter) and the node N. Also, as illustrated in FIG. 15(c), the resonator RP may be connected between the matching circuit 34 and the common terminal Ant.

The above description of the embodiment 2 is given of the example in which the resonator RP is connected between the common terminal Ant and the node N. However, the resonator RP may be provided in the transmission filter 30 and the reception filter 32. That is, the duplexer may include the filter of the embodiment 1.

Embodiment 3

Figure 16A:
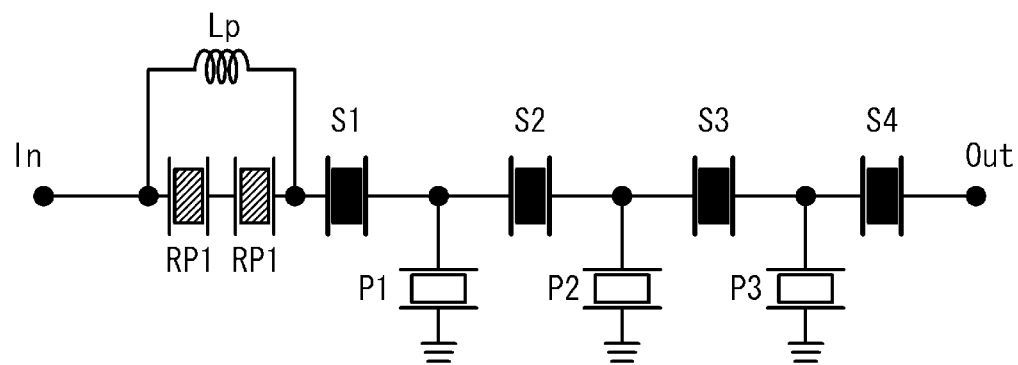
FIGS. 16($a$) and 16($b$) are diagrams of filters in accordance with an embodiment 3.
Figure 16B:
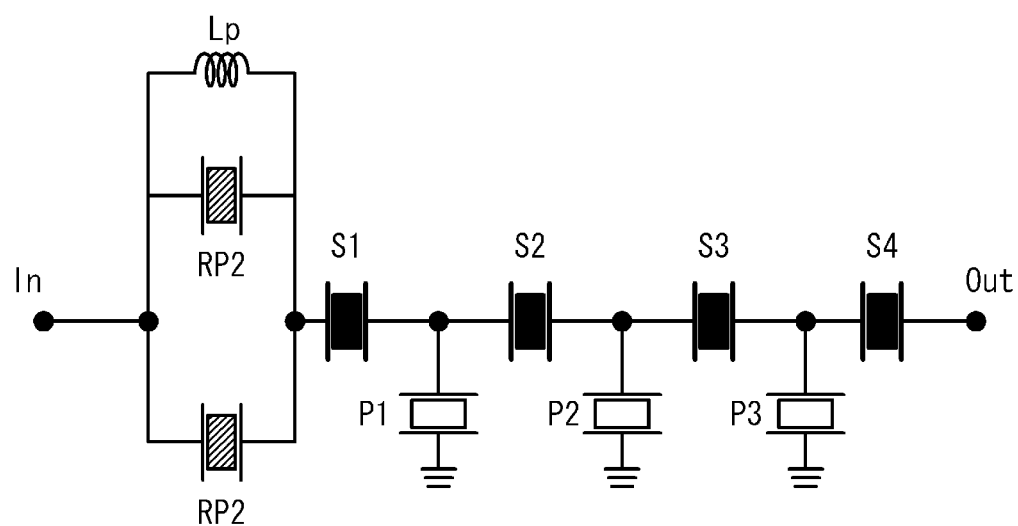

Embodiment 3 is an example in which a resonator with which an inductor is connected in parallel is divided into multiple resonators connected in series or parallel. FIGS. 16(a) and 16(b) are circuit diagrams of the embodiment 3. In the example in FIG. 16(a), the resonator to which the inductor Lp is connected is divided into two resonators RP1. The two resonators RP1 are connected in series. In the example in FIG.

16(b), the resonator to which the inductor Lp is connected is divided into two resonators RP2. The two resonators RP2 are connected in parallel.

According to the embodiment 3, the resonator with which the inductor is connected in parallel is divided into multiple resonators connected in series or parallel, so that the power density per resonator can be reduced and the outputting of unwanted waves resulting from non-linear deformation and durability can be improved. Preferably, the divided resonators have an identical capacitance in order to equalize the power density per resonator.

Embodiment 4

Figure 17A:
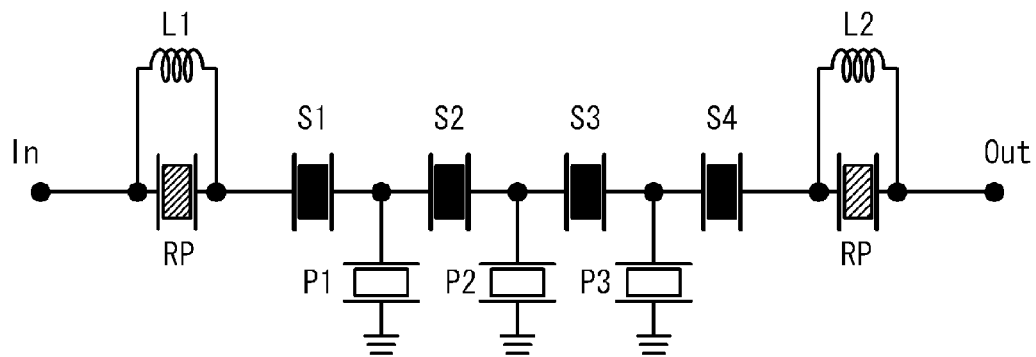
FIGS. 17($a$) and 17($b$) are diagrams of filters in accordance with an embodiment 4.
Figure 17B:
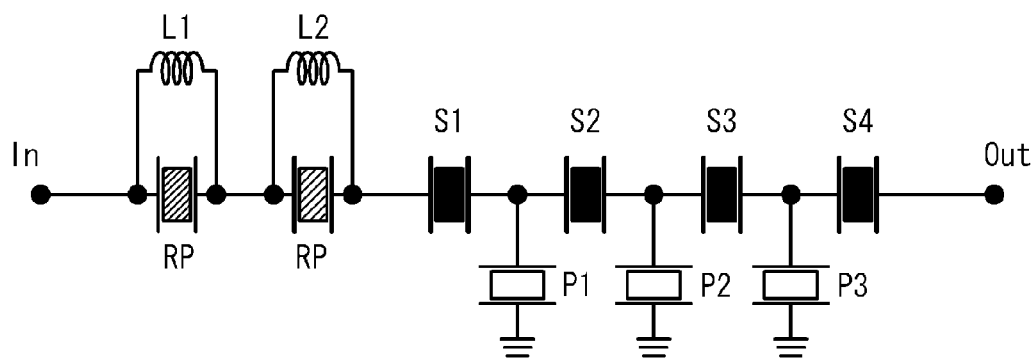

Embodiment 4 is an example in which there are provided multiple resonators with which inductors Lp are connected in parallel. FIGS. 17(a) and 17(b) are circuit diagrams of the embodiment 4. In the example illustrated in FIG. 17(a), a resonator RP with which an inductor L1 is connected in parallel is connected between the input terminal In and the series resonator S1. Another resonator RP with which an inductor L2 is connected in parallel is connected between the output terminal and the series resonator S4. In the example in FIG. 17(b), between the input terminal In and the series resonator S1, there are connected a resonator RP with which an inductor L1 is connected in parallel and another resonator RP with which an inductor L2 is connected in parallel.

According to the embodiment 4, the multiple resonators RP with which the inductors are connected in parallel are connected in series. The inductors may have different inductances, so that multiple attenuation poles can be formed. For example, the inductance of the inductor L1 is selected so that one attenuation pole is formed at the frequency of the second harmonic of the pass band, and the inductance of the inductor L2 is selected so that another attenuation pole is formed at the frequency of the third harmonic of the pass band (that is, so that the attenuation poles are formed at the different harmonics). The multiple resonators RP may be provided in arbitrary positions as long as the multiple resonators RP are connected in series between the input terminal In and the output terminal Out.

Embodiment 5

Figure 18A:
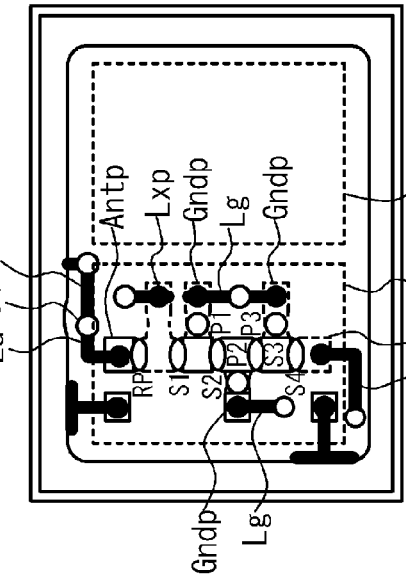
FIGS. 18($a$) through 18($d$) are diagrams of a duplexer in accordance with an embodiment 5.
Figure 18B:
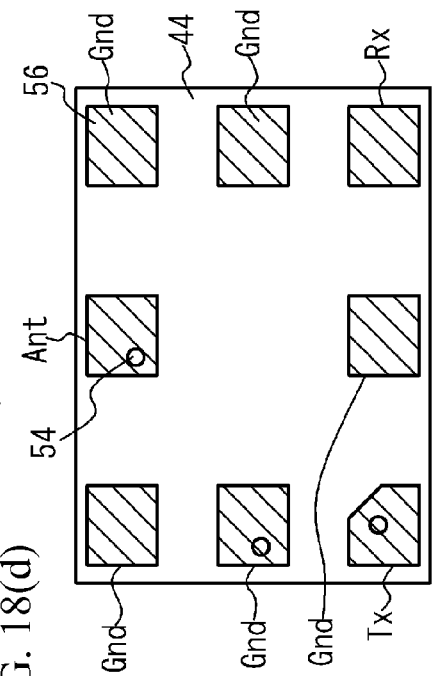
Figure 18C:
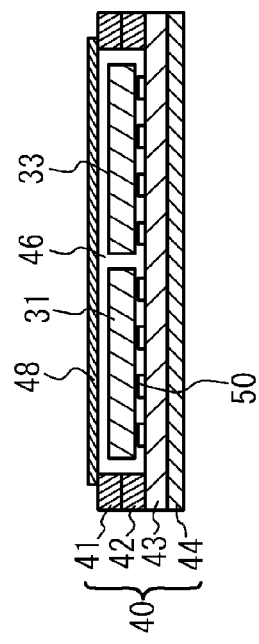
Figure 18D:
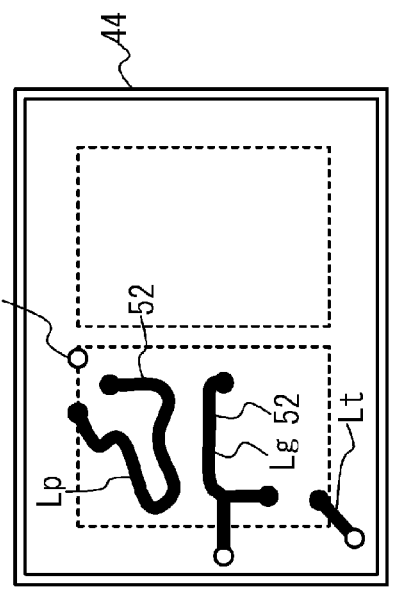

Embodiment 5 is an exemplary duplexer having a multilayer stacked package. FIG. 18(a) is a sectional view of a multilayer stacked package, FIG. 18(b) is a view of a surface of a die attach layer seen through a filter chip; FIG. 18(c) is a view of a surface of a footpad layer (the position of the filter chip is indicated by a broken line), and FIG. 18(d) is a view of a back surface of the footpad layer seen through from the front surface side. As illustrated in FIG. 18(a), a multilayer stacked package 40 has four ceramic layers of a first layer 41, a second layer 42, a die attach layer 43, and a footpad layer 44. The first layer 41 and the second layer 42 form a cavity 46 used for sealing filter chips 31 and 33. A ridge 48 is firmly fixed on the first layer 41, so that the filter chips 31 and 33 can be sealed. The filter chips 31 and 33 are flip-chip bonded on the surface of the die attach layer 43 via bumps 50. Foot pads 56 are formed on the back surface of the footpad layer 44. The transmission filter 30 of the embodiment 2 is formed on the filter chip 31, and the reception filter 32 of the embodiment 2 is formed on the reception filter 32.

Figure 19:
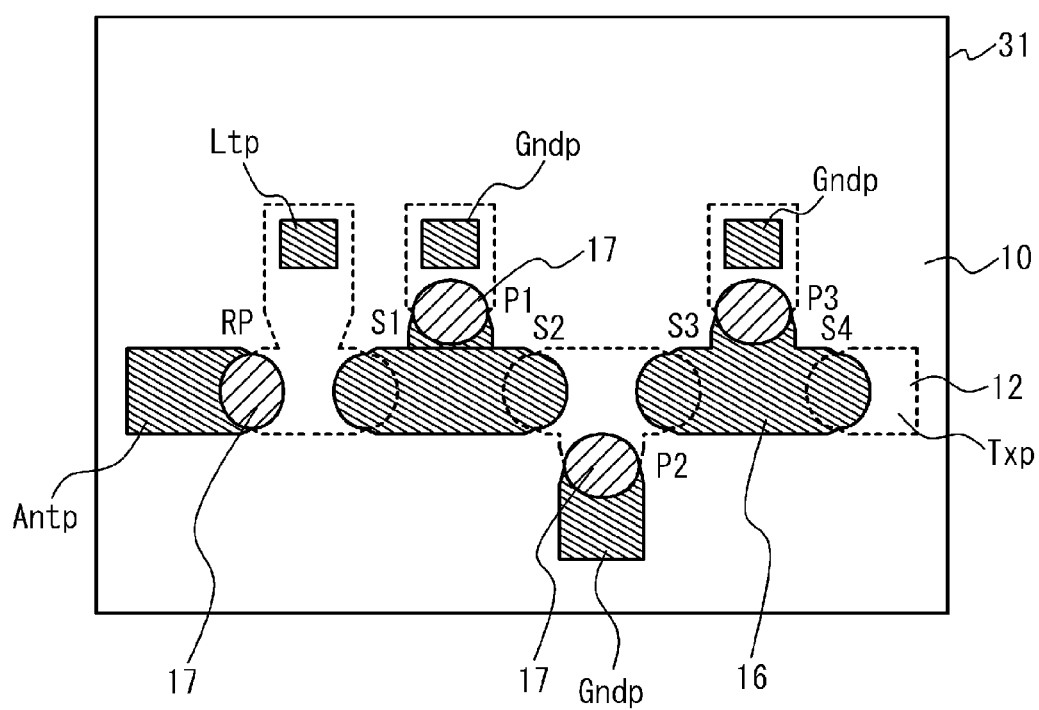
FIG. 19 is a plan view of a filter chip.

FIG. 19 is a plan view of the transmission filter chip 31. On the filter chip 31, there are formed a common pad Antp, an inductor pad Lxp, a transmission pad Txp and ground pads Gndp. The other structures are the same as those illustrated in FIG. 12(a), and a description thereof is omitted here.

As illustrated in FIG. 18(b), the transmission filter chip 31 and the reception filter chip 33 are flip-chip mounted on the surface of the die attach layer 43. Metal interconnections 52 are formed on the surface of the die attach layer 43. Via holes 54 in which a metal passing through the die attach layer 43 is buried are formed in the die attach layer 43. As illustrated in FIG. 18(c), the metal interconnections 52 are formed on the surface of the footpad layer 44. Via holes 54 in which a metal passing through the footpad layer 44 is buried are formed in the footpad layers 44. As illustrated in FIG. 18(d), footpads 56 for extracting electric signals to the outside of the filter chip are formed on the back surface of the footpad layer 44. Symbols Ant, Tx, Rx and Gnd are respectively footpads for the common terminal, the transmission terminal, the reception terminal and the ground terminals.

In FIGS. 18(b) through 18(d), the metal interconnections 52 and the via holes 54 for the transmission filter are illustrated, while the metal interconnections and the via holes for the reception filter are omitted here. The transmission pad Txp of the filter chip 31 is connected to the food pad of the transmission terminal Tx via interconnection lines Lt and the corresponding via holes 54. The common pad Antp of the filter chip 31 is connected to the footpad of the common terminal Ant via interconnection lines La and the corresponding via holds 54. The ground pad Gndp of the filter chip 31 is connected to the footpad of the ground terminal GnNd via interconnection lines Lg and the corresponding via holds 54. The inductor Lp formed by the metal interconnection 52 is connected in parallel between the common pad Antp and the inductor pad Lxp of both sides of the resonator RP.

According to the embodiment 5, the inductor Lp is formed by the conductor line formed within the package in which the filter chips 31 and 33 are mounted. It is thus possible to downsize the duplexer or the filter. In the above description of the embodiment 5, the inductor Lp is formed by the conductor line on the ceramic layer. However, the inductor Lp may be formed by a conductor line on an insular layer such as a ceramic substrate or a printed circuit board.

Embodiment 6

Figure 20A:
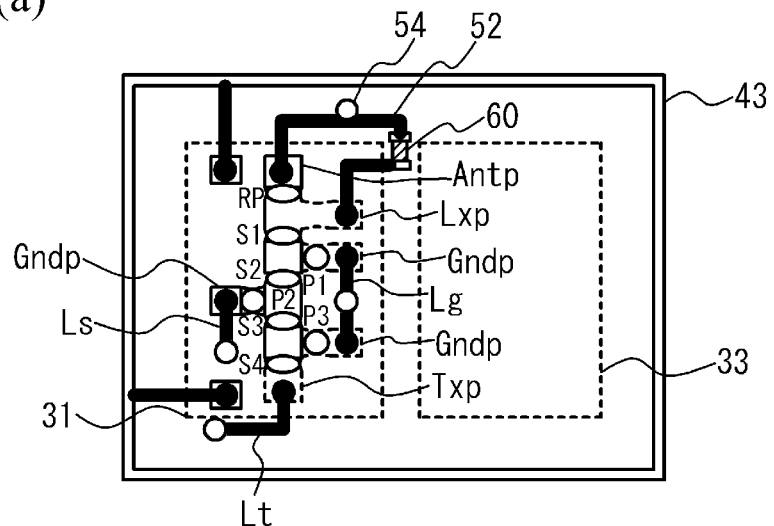
FIGS. 20($a$) through 20($c$) are diagrams of a duplexer in accordance with an embodiment 6.
Figure 20B:
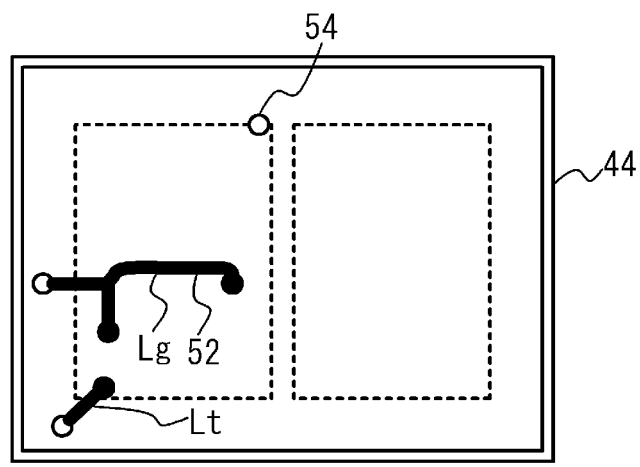
Figure 20C:
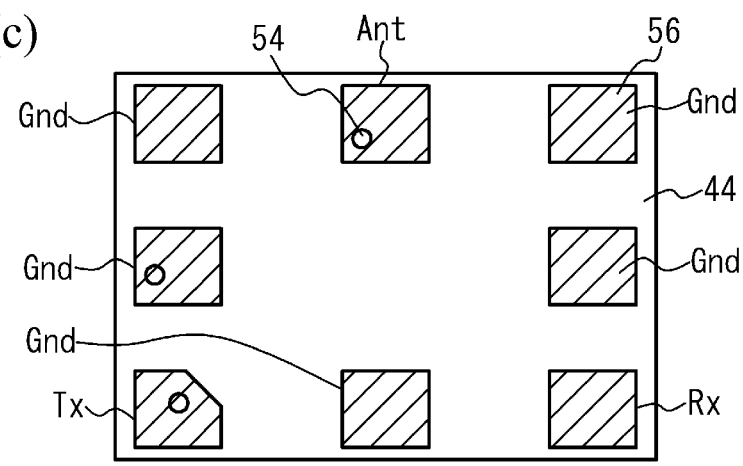

Embodiment 6 is an exemplary inductor formed by a chip inductor. FIG. 20(a) is a view of the front surface of a die attach layer employed in the embodiment 6, FIG. 20(b) is a view of the front surface of a footpad layer, and FIG. 20(c) is a view of the back surface of the footpad layer seen through the footpad layer from the surface side. As illustrated in FIGS. 20(a) and 20(b), the inductor Lp is formed by a chip inductor 60 instead of the metal interconnection 52 in FIG. 18(c). The other structures are the same as those of the embodiment 5, and a description thereof is omitted here.

According to the embodiment 6, the inductor Lp is formed by the chip inductor 60, and the Q value of the inductor Lp can be improved and the suppression characteristic can be improved. The chip inductor 60 may be provided within the package, which may, for example, be the surface of the footpad layer 44.

Embodiment 7

Figure 21:
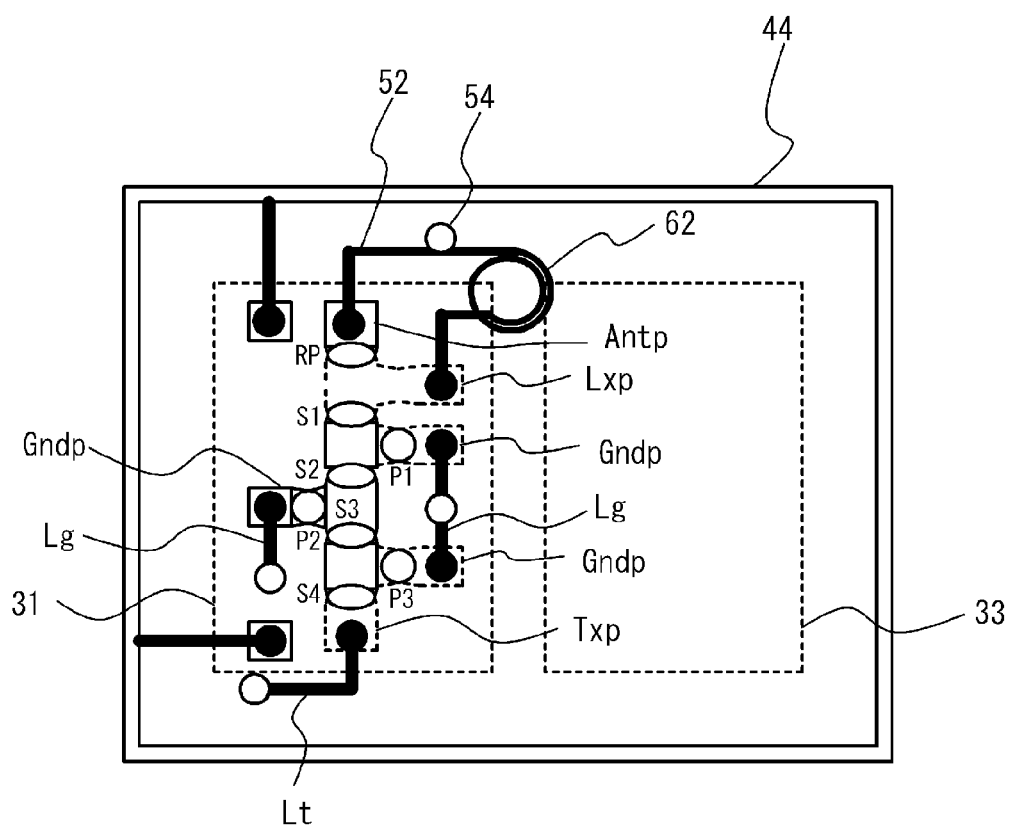
FIG. 21 is a diagram of a duplexer in accordance with an embodiment 7.

Embodiment 7 is an exemplary inductor formed by a lumped constant coil. FIG. 21 illustrates the surface of a die attach layer employed in the embodiment 7. As illustrated in FIG. 21, the inductor Lp is formed by a lumped constant coil 62 instead of the chip inductor. The other structures are the same as those of the embodiment 6, and a description thereof is omitted here.

According to the embodiment 7, since the inductor Lp is formed by the lumped constant coil 62, so that the Q value of the inductor Lp can be improved and the suppression characteristics can be improved. The lumped constant coil 62 may be provided within the package 40, which maybe the surface of the footpad layer 44, for example.

Embodiment 8

Figure 22:
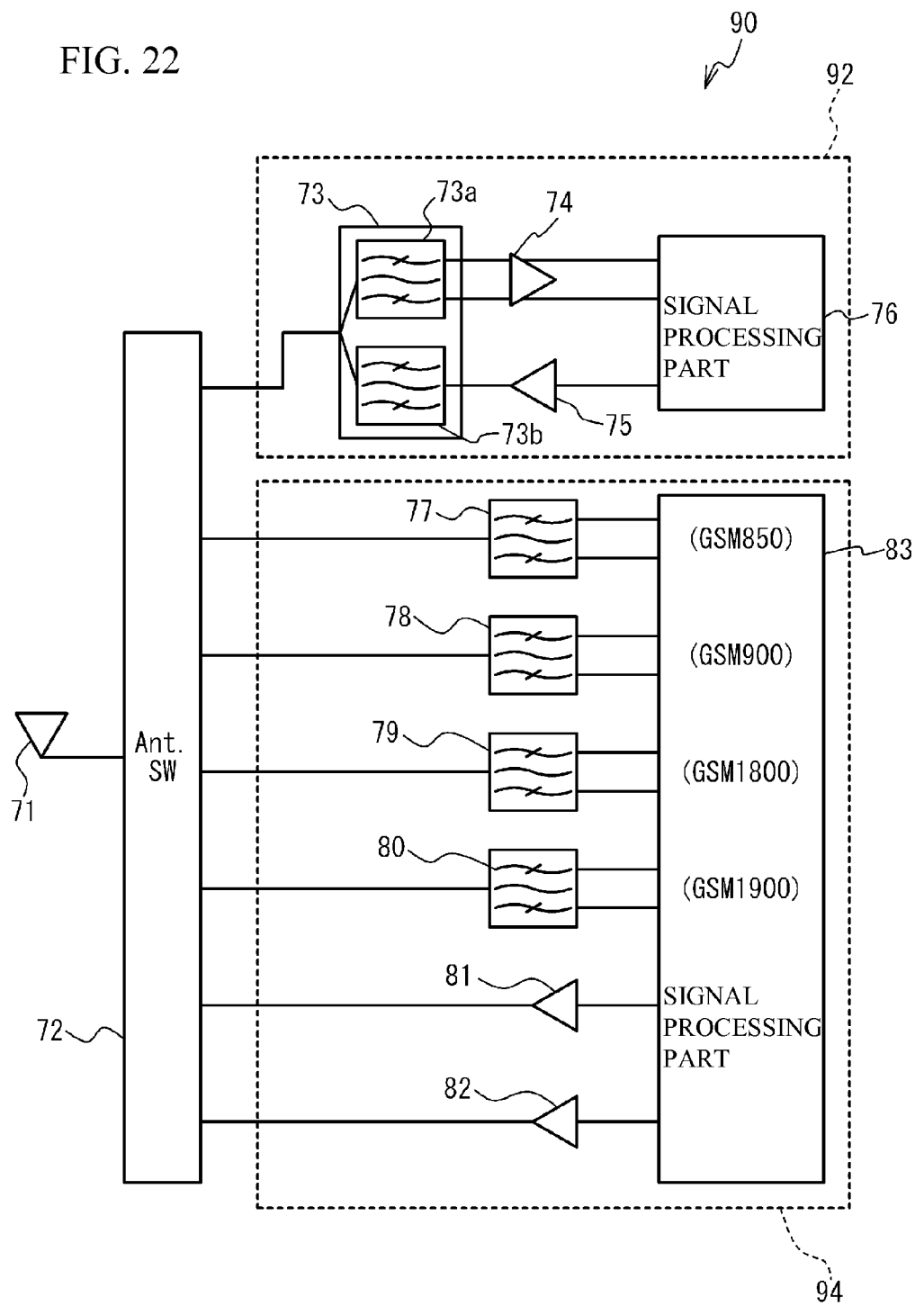
FIG. 22 is a diagram of an electronic device in accordance with an embodiment 8.

Embodiment 8 illustrates an exemplary cellular phone terminal, which is an electronic device using the duplexer of any of the embodiments 1~7. FIG. 22 is a block diagram of an RF (Radio Frequency) part of a cellular phone terminal 90. The cellular phone terminal 90 supports both GSM (Global System for Mobile communication) and W-CDMA (Wideband Code Division Multiple Access). GSM supports the 850 MHz band (GSM 850), 900 MHz band (GSM900), 1800 MHz band (GSM1800), and 1900 MHz band (GSM 1900). An antenna 71 is capable of transmitting and receiving signals of both GSM and W-CDMA. An antenna switch 72 selects a W-CDMA part 92 to connect the W-CDMA part 92 and the antenna 71 when signals of W-CDMA are received or transmitted. When signals of GSM are received or transmitted, the antenna switch 72 selects a GSM part 94 to connect the GSM part 94 and the antenna 71.

The W-CDMA part 92 is equipped with a duplexer 73, a low noise amplifier 74, a power amplifier 75 and a signal processing part 76. The signal processing part 76 generates a W-CDMA signal. The power amplifier 75 amplifies the transmission signal . A reception filter 73a of the duplexer 73 passes the reception signal and applies it to the antenna switch 72. The reception filter 73a passes the W-CDMA reception signal from the antenna switch 72 and connects it to the low noise amplifier 74. The low noise amplifier 74 amplifies the reception signal. The signal processing part 76 down converts the reception signal and outputs a down converted signal to a following processing part.

The GSM part 94 is equipped with filters 77~80, power amplifiers 81 and 82, and a signal processing part 83. The signal processing part 83 generates a GSM transmission signal. The power amplifier 81 amplifies transmission signals of GSM850 and GSM900. The power amplifier 82 amplifies transmission signals of GSM1800 and GSM1900. The antenna switch 72 selects either the power amplifier 81 or 82 in accordance with the type of GSM signal. The antenna switch 72 selects the filters 77~80 in accordance with the type of GSM signal received via the antenna 71. The filters 77~80 filter the reception signals and output filtered signals to the signal processing part 83. The signal processing part 83 down converts the reception signals and output filtered signals to a following processing part.

In the embodiment 8, at least one of the filters 73a, 73b and 77~80 may be the filter of any of the embodiments 1, 3 and 4. The duplexer 73 may be the duplexer of any of the embodiments 2 and 5~7. It is thus possible to provide the electronic device having the improved filter characteristics. Since the transmission signal contains many harmonic components, the filter 73b is preferably the filter of any of the embodiments 1, 3 and 4.

Some embodiments of the present invention have been described. However, the present invention is not limited to these specifically described embodiments but may have various variations and alterations within the scope of the claimed invention.

The invention claimed is:

1. A duplexer comprising:
a transmission filter connected in series between a node and a transmission terminal and a reception filter connected in series between the node and a reception terminal, at least one of which includes series resonators connected in series between the node and at least one of the transmission terminal and the reception terminal, and parallel resonators connected in parallel between the node and the at least one of the transmission terminal and the reception terminal;
a resonator connected in series between the node and a common terminal; and
an inductor connected in parallel with the resonator between the node and the common terminal,
wherein the resonator has a resonance frequency lower than resonance frequencies of the series resonators when the inductor is not connected to the resonator.

2. An electronic device comprising:
an antenna;
a transmission filter connected in series between a node and a transmission terminal and a reception filter connected in series between the node and a reception terminal, at least one of which includes series resonators connected in series between the node and at least one of the transmission terminal and the reception terminal, and parallel resonators connected in parallel between the node and the at least one of the transmission terminal and the reception terminal;
a resonator connected in series between the node and the output terminal the antenna; and
an inductor connected in parallel with the resonator between the node and the antenna,
wherein the resonator has a resonance frequency lower than resonance frequencies of the series resonators when the inductor is not connected to the resonator.

3. The duplexer filter according to claim 1, wherein the resonance frequency of the resonator is higher than the resonance frequencies of the parallel resonators.

4. The duplexer filter according to claim 1, wherein the resonance frequency of the resonator is equal to the resonance frequencies of the parallel resonators.

5. The duplexer filter according to claim 1, wherein the resonance frequency of the resonator forms an attenuation pole at a low-frequency side of a pass band of the at least one of the transmission filter and the reception filter.

6. The duplexer filter according to claim 1, wherein the inductor has an inductance that forms an attenuation pole at a high-frequency side of a pass band of the the at least one of the transmission filter and the reception filter.

7. The duplexer filter according to claim 1, wherein the inductor has an inductance that forms a plurality of attenuation poles at frequencies equal to inter multiples of a pass band of the at least one of the transmission filter and the reception filter.

* * * * *